United States Patent
Thomas et al.

(10) Patent No.: US 9,035,726 B2
(45) Date of Patent: May 19, 2015

(54) SAW FILTER CIRCUIT HAVING IMPROVED ESD RESISTANCE

(75) Inventors: Ralf Thomas, Munich (DE); Franz Kubat, Munich (DE); Andreas Detlefsen, Eichenau (DE); Markus Hauser, Feldafing (DE)

(73) Assignee: EPCOS AG, Munich (DE)

( * ) Notice: Subject to any disclaimer, the term of this patent is extended or adjusted under 35 U.S.C. 154(b) by 389 days.

(21) Appl. No.: 13/383,071

(22) PCT Filed: Jul. 12, 2010

(86) PCT No.: PCT/EP2010/059986
§ 371 (c)(1),
(2), (4) Date: Mar. 19, 2012

(87) PCT Pub. No.: WO2011/006873
PCT Pub. Date: Jan. 20, 2011

(65) Prior Publication Data
US 2012/0161903 A1    Jun. 28, 2012

(30) Foreign Application Priority Data
Jul. 13, 2009 (DE) .................. 10 2009 032 840

(51) Int. Cl.
*H03H 9/64* (2006.01)
*H03H 9/02* (2006.01)

(52) U.S. Cl.
CPC ......... *H03H 9/02921* (2013.01); *H03H 9/6433* (2013.01)

(58) Field of Classification Search
USPC ........................................................ 333/195
See application file for complete search history.

(56) References Cited

U.S. PATENT DOCUMENTS

| 5,963,113 A * | 10/1999 | Ou et al. ............ 333/193 |
| 6,339,704 B1 | 1/2002 | Furukawa |
| 6,606,016 B2 | 8/2003 | Takamine |
| 6,731,188 B2 | 5/2004 | Sawada et al. |
| 6,891,451 B2 | 5/2005 | Sawada |
| 7,388,456 B2 | 6/2008 | Furusato et al. |
| 7,999,636 B2 | 8/2011 | Bauer et al. |
| 2006/0158281 A1 | 7/2006 | Garris et al. |

(Continued)

FOREIGN PATENT DOCUMENTS

| DE | 10 2006 010 752 A1 | 9/2007 |
| EP | 0 940 915 A2 | 9/1999 |

(Continued)

OTHER PUBLICATIONS

Ruppel, C., et al., "SAW Devices for Consumer Communication Applications," IEEE Transactions on Ultrasonics, Ferroelectrics and Frequency Control, vol. 40, No. 5, Sep. 1993, 14 pages, New York, New York.

(Continued)

*Primary Examiner* — Stephen E Jones
*Assistant Examiner* — Scott S Outten
(74) *Attorney, Agent, or Firm* — Slater & Matsil, L.L.P.

(57) ABSTRACT

A SAW filter circuit having improved ESD resistance is specified, in which a series interconnection composed of SAW resonators is interconnected between a first signal port and a dual-mode SAW filter port. The static capacitance of the series interconnection is at most four times the static capacitance of the dual-mode SAW filter transducers interconnected therewith.

18 Claims, 1 Drawing Sheet

(56) References Cited

U.S. PATENT DOCUMENTS

| | | | |
|---|---|---|---|
| 2006/0244550 A1* | 11/2006 | Inoue et al. | 333/133 |
| 2007/0236308 A1 | 10/2007 | Takamine | |
| 2008/0079512 A1 | 4/2008 | Nakazawa et al. | |
| 2009/0289745 A1* | 11/2009 | Bauer et al. | 333/195 |
| 2010/0148887 A1 | 6/2010 | Matsuda et al. | |

FOREIGN PATENT DOCUMENTS

| | | |
|---|---|---|
| EP | 1 337 039 A1 | 8/2003 |
| EP | 2 034 611 A1 | 3/2009 |
| JP | 5183380 A | 7/1993 |
| JP | 629779 A | 2/1994 |
| JP | 786870 A | 3/1995 |
| JP | 7212183 A | 8/1995 |
| JP | 9181565 A | 7/1997 |
| JP | 20017680 A | 1/2001 |
| JP | 2001326557 A | 11/2001 |
| JP | 200264358 A | 2/2002 |
| JP | 2002290205 A | 10/2002 |
| JP | 2002314371 A | 10/2002 |
| JP | 200539811 A | 2/2005 |
| JP | 2006514460 A | 4/2006 |
| JP | 2007534243 A | 11/2007 |
| JP | 2008-147905 A | 6/2008 |
| WO | 2008101482 A1 | 8/2008 |
| WO | 2009060594 A1 | 5/2009 |
| WO | WO 2009/063559 A1 | 5/2009 |

OTHER PUBLICATIONS

Campbell, C., "Surface Acoustic Wave Devices," XP-002607517, ISBN: 0-12-157340-0, 4 pages, 1998, Academic Press, San Diego, California.

* cited by examiner

SAW FILTER CIRCUIT HAVING IMPROVED ESD RESISTANCE

This patent application is a national phase filing under section 371 of PCT/EP2010/059986, filed Jul. 12, 2010, which claims the priority of German patent application 10 2009 032 840.8, filed Jul. 13, 2009, each of which is incorporated herein by reference in its entirety.

TECHNICAL FIELD

The invention relates to components operating with acoustic waves and, in particular embodiments, a SAW filter circuit having improved ESD resistance.

BACKGROUND

SAW components are known, for example, from the document "SAW Devices for Consumer Communication Applications" (IEEE Transactions on Ultrasonics, Ferroelectrics, and Frequency Control, Vol. 40, No. 5, September 1993). However, the finite conductivity of the electrically insulating materials, e.g. of the piezoelectric substrates, which are employed in components operating with acoustic waves can lead to a charge transfer between conductive circuit elements that are at different electrical potentials. Such a charge transfer, e.g., a so-called ESD pulse, regularly leads to destruction, or at least to functional impairment of such SAW components.

It is known from the document U.S. Pat. No. 7,388,456 B2 that SAW filters can be protected against ESD pulses by means of cascaded resonators. In ladder-type structures, in particular, a ratio of substantially 1:1 of the capacitances of serial and parallel transducers is advantageous.

Furthermore, the trivial solution, namely increasing the spatial distance between the conductive structures, firstly goes against the continuous trend toward miniaturization. Secondly, the wavelengths of acoustic waves generally determine the characteristic distance between such electrode structures. Thus, the acoustic wavelength substantially determines the finger spacing of interdigital structures. A simple increase in the finger distances would then considerably impair the electroacoustic properties of such components.

SUMMARY

Embodiments of the invention relate to components operating with acoustic waves—more particularly components operating with surface acoustic waves (SAW components)—having improved ESD protection by means of topologies of the electrode structures that are optimized with regard to the electric field strengths present.

In one aspect, the present invention specifies an electrode topology which is distinguished by improved ESD protection and the electroacoustic properties of which are nevertheless substantially not made worse.

The invention proposes a SAW filter circuit comprising a first and a second signal port. The filter circuit furthermore comprises a piezoelectric substrate, on which a DMS filter (Dual Mode SAW filter) having a first DMS port and one or a plurality of first DMS transducers interconnected therewith and having a second DMS port with one or a plurality of second DMS transducers interconnected therewith are arranged. The number of first DMS transducers can be one. However, the number of first DMS transducers can also be higher. Likewise, the number of second DMS transducers can be one, but also higher. Furthermore, the filter circuit comprises a first series interconnection composed of one or a plurality of SAW resonators interconnected between the first signal port and the first DMS port of the DMS filter. In this case, the static capacitance of the first series interconnection is at most four times the static capacitance of the first DMS transducers interconnected therewith. In this case, the static capacitance of resonators or transducers denotes the capacitance of the electrode structure at frequencies at which no acoustic waves are excited in the piezoelectric substrate.

Such a cascading of resonators generally serves for matching the impedance of the circuit or for optimizing the attenuation characteristic, both at frequencies of the stop and at frequencies of the pass band. For this purpose, it was regularly necessary for the static capacitance of such resonators interconnected in series with the DMS structure to be made high.

The serial interconnection of one or a plurality of SAW resonators between the first signal port and the first DMS port has the following effect. However here, in principle, electrical RF voltages which are applied between the signal port, which can be an input of a filter circuit, and the first DMS port, which can constitute the input of a DMS filter circuit to be protected against ESD pulses, are substantially divided according to the ratio of the static capacitances of the electrode structures of the resonators and of the first DMS transducers. Therefore, the DMS port, i.e., the DMS filter structure, no longer "sees" the full voltage present, but rather only that part of the voltage which results from the ratio of the static capacitances of the DMS transducer and of the SAW resonators interconnected in the series interconnection. In this case, the partial voltage present at the DMS port is all the lower, the lower the capacitance of the first series interconnection composed of SAW resonators. This fundamental viewpoint is valid when the frequency spectrum of the ESD pulses has no or only a few frequency components of the operating frequency of the resonators; it has therefore been recognized that the ESD resistance can be increased at the expense of the quality factor of the filter effect. Furthermore, a ratio of the static capacitances has been found for which the ESD protection is improved in such a way that the resulting deterioration in the filter characteristic does not exceed values that are maximally to be afforded tolerance.

This dilemma is therefore resolved in an advantageous manner by the present invention. By virtue of the specified quantitative relationship of the capacitances of the capacitive elements, an SAW filter circuit is specified which satisfies the demands both with regard to ESD resistance and with regard to the electroacoustic filter characteristic. Depending on the loss of quality factor that can be afforded tolerance, maximum ratios of 3.5 or 3 or even 2.5 are also appropriate.

In a further advantageous configuration of the invention, the SAW filter circuit comprises a second series interconnection composed of SAW resonators, which is interconnected between the second signal port and the second DMS port. In this case, the static capacitance of the second series interconnection is at most four times the static capacitance of the second DMS transducers interconnected therewith. The same argumentation as above is applicable. Ratios of 3.5 or 3 or 2.5 are appropriate here, too.

Analogous to the argumentation mentioned above, the ESD resistance is thereby improved even further, without an excessively great impairment of the filter characteristic having to be accepted.

The protection against electrostatic discharge or overvoltage of the filter circuit can be improved even further, in one advantageous configuration, by virtue of the fact that a first interconnection composed of SAW resonators is interconnected in a parallel branch with the first DMS port. The parallel branch can then interconnect the first DMS port with ground. The interconnection in the parallel branch comprises at least one resonator. Analogous to ladder-type filter circuits, the resonators in the parallel branch are called "parallel resonators". In this case, the static capacitance CS1 of the first series interconnection is at most double the sum of the static capacitances of the resonators CP1 of the interconnection in a parallel branch and of the first DMS transducers CDMS1 interconnected therewith:

$CS1<=2*(CP1+CDMS1)$, or equivalently:

$CP1<=0.5*CS1-CDMS1$.

In other words, the static capacitance of the interconnection composed of parallel resonators is less than the difference between half of the static capacitance of the first series interconnection and the static capacitance of the first DMS transducers.

Furthermore, a second interconnection composed of SAW resonators in a parallel branch interconnected with the second DMS port can furthermore improve the ESD resistance. In that case, the static capacitance CS2 of the second series interconnection is at most double the sum of the static capacitances of the second interconnection in a parallel branch CP2 and of the second DMS transducers CDMS2 interconnected therewith. The following arises analogously to above:

$CS2<=2*(CP2+CDMS2)$, or equivalently:

$CP2<=0.5*CS2-CDMS2$.

In one embodiment, the SAW filter circuit comprises a multi-port resonator in the first series interconnection, the second series interconnection, the first interconnection (interconnected in a parallel branch) or the second interconnection (interconnected in a parallel branch). In contrast to a simple resonator having one interdigital structure (transducer) consisting of two electrodes, a multi-port resonator generally comprises at least two transducers. One of the latter is then a first transducer, e.g., an input transducer. Another is a second transducer, e.g., an output transducer. However, it is also possible for the at least two transducers of the multi-port resonator to be interconnected in parallel and to be connected, for example, to the two branches of a signal line of the filter carrying a balanced signal.

The above mentioned features are applicable independently of whether the signal routing in the filter circuit is routed in a balanced fashion or in an unbalanced fashion (i.e., relative to ground). Accordingly, independently of one another, both the first signal port and the second signal port can be routed both in a balanced fashion and in an unbalanced fashion. The DMS structure can therefore be used as a balun (i.e., as a "balanced-unbalanced" converter/as a balancing matching circuit).

In one embodiment, in the SAW filter at least one transducer which can be interconnected in one of the interconnections, selected from first series interconnection, second series interconnection, first interconnection, second interconnection and DMS filter, is arranged alongside one or a plurality of further transducers along the longitudinal direction. In this case, the longitudinal direction is determined by the direction of propagation of the surface acoustic waves which are excited by the electrode structures of the transducers at the surface of the piezoelectric substrate and propagate in the so-called acoustic track. One or a plurality of structured reflector elements can be arranged between transducers in the acoustic track. It is advantageous if the reflector elements are floating, i.e., not interconnected with ground. This is because the voltage present between the reflector elements and the finger structures of the transducers is reduced in that case. In particular, the interconnection can comprise a multi-port resonator.

In one configuration, a resonator element is arranged between a first and a second transducer of a multi-port resonator. The multi-port resonator is interconnected serially, i.e., in series in the signal path. The reflector element comprises at least two structured reflector fingers.

Furthermore, it is advantageous if directly adjacent electrode fingers of different transducers which are arranged alongside one another within the acoustic track have the same polarity.

Such directly adjacent electrode fingers of different transducers or resonators can be interconnected with ground.

Such directly adjacent electrode fingers of different transducers can be interconnected in a multi-port resonator. The multi-port resonator in turn can be interconnected in parallel, i.e., in a parallel branch interconnected with ground.

Furthermore, it is advantageous if a first transducer adjacent to a second transducer and the first transducer are embodied in such a way that their directly adjacent electrode fingers are interconnected with ground, independently of whether the transducers are interconnected in a single- or multi-port resonator.

In a further configuration of the filter circuit, between adjacent electrode fingers of different transducers and having potentials of opposite polarity, reflector elements are arranged on the piezoelectric substrate.

Also between adjacent electrode fingers having different polarities and of different transducers, which are both first transducers or which are both second transducers, reflector elements can be arranged on the piezoelectric substrate.

Also between adjacent electrode fingers having different polarities and of different transducers, which are both interconnected in one and the same resonator, e.g., a multi-port resonator, reflector elements can be arranged on the piezoelectric substrate. Such a multi-port resonator can be interconnected in a series interconnection or in a parallel interconnection.

In one embodiment, a series interconnection, e.g., the first series interconnection, or an interconnection, e.g., the first interconnection, comprises resonators interconnected in a cascaded fashion.

As a further-reaching measure for improving the ESD resistance of SAW filter circuits, the voltage present between a signal port and a DMS port can be reduced by further capacitive elements interconnected in series. In this case, not only SAW resonator structures but very generally capacitive elements formed from metalized structures are appropriate as capacitive elements. In particular, such capacitive elements are advantageous which are structured on the piezoelectric substrate or are integrated as metalized areas in an HTTC (High Temperature Co-fired Ceramic) or LTTC (Low Temperature Co-fired Ceramic) multilayer substrate. In particular, such structured interdigital transducers whose electroacoustic coupling coefficient vanishes on account of the alignment relative to the piezoelectric substrate are also appropriate.

It is advantageous if a SAW filter circuit is realized in such a way that the voltage present between a signal port and a DMS port is not dropped between two electrode structures whose finger centers are at a distance smaller than half of the acoustic wavelength of a center frequency.

BRIEF DESCRIPTION OF THE DRAWINGS

The SAW filter circuit is explained in greater detail below on the basis of exemplary embodiments and associated schematic figures, in which.

DETAILED DESCRIPTION OF ILLUSTRATIVE EMBODIMENTS

Figure 1:
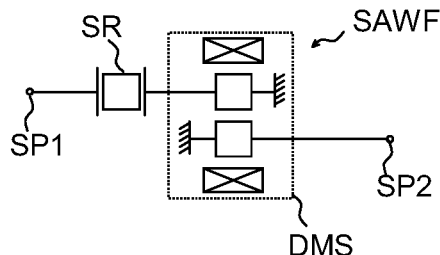
FIG. 1 shows the schematic construction of a filter circuit according to the invention.

FIG. 1 illustrates a SAW filter circuit SAWF having improved ESD resistance. A DMS filter structure DMS is interconnected in series with a serial resonator SR between a first signal port SP1 and a second signal port SP2. Both signal ports are embodied in unbalanced fashion here. The one serial resonator SR constitutes the simplest embodiment of the series interconnection mentioned.

Figure 2:
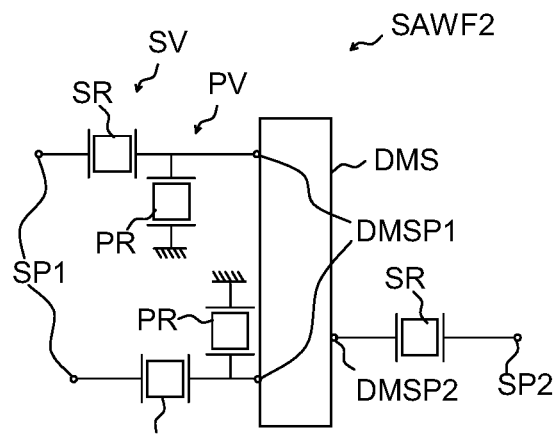
FIG. 2 shows a configuration in which the first signal port is embodied in a balanced fashion and the second signal port is embodied in an unbalanced fashion.

FIG. 2 illustrates a configuration of a SAW filter circuit SAWF2 which is improved with regard to the ESD protection and the first signal port SP1 of which is embodied in a balanced fashion. Accordingly, the first DMS port DMSP1 is also embodied in a balanced fashion. A series interconnection SV composed of one or a plurality of SAW resonators is interconnected in each of the two branches of the signal lines embodied in a balanced fashion. The series interconnection of the resonators is symbolized here by the one series resonator SR illustrated. In between the series resonators SR and the respective first DMS port input DMSP1, a respective interconnection of resonators is interconnected in a parallel branch with the first DMS port DMSP1. The interconnection is symbolized by the parallel resonators PR. The parallel resonators are therefore arranged in a shunt branch connected, e.g., relative to ground. A second series interconnection composed of SAW resonators is interconnected between the second signal port SP2 routed in an unbalanced fashion and the second port DMSP2 of the DMS filter, which second port is routed correspondingly in an unbalanced fashion, the second series interconnection being symbolized by a series resonator SR.

The interconnection illustrated here is schematic. Combinations of series and parallel resonators such as are interconnected, e.g., in ladder-type circuits are likewise conceivable and constitute possible configurations of the invention. Ground-side outputs of parallel resonators PR of signal lines routed in a balanced fashion can be interconnected with one another. They can be interconnected among one another and with ground. However, they can also constitute a so-called floating ground if they are only interconnected with one another, without being directly electrically connected to ground.

Figure 3A:
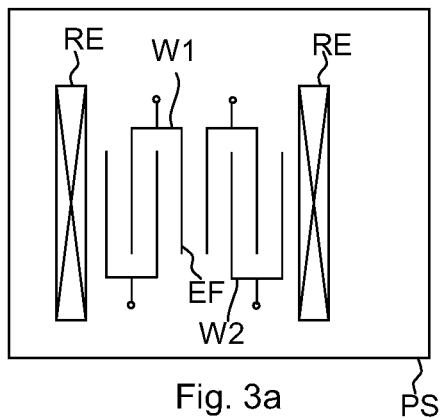
FIG. 3A shows the arrangement of two interdigital structures which are arranged alongside one another and which are arranged between two reflective elements.

FIG. 3A schematically illustrates a possible relative arrangement of the transducers with respect to one another. Two transducers W1, W2 arranged alongside one another are arranged in an acoustic track between two reflective elements RE. The transducers W1, W2 include electrode fingers EF. The transducers can be transducers in the first series interconnection, in the second series interconnection, in the first interconnection, in the second interconnection or in the DMS filter. Their relative alignment with respect to the crystal axes of the piezoelectric substrate PS is dependent on the desired electroacoustic coupling coefficient. If an electroacoustic interaction of the transducers is desired, then a correspondingly high coupling coefficient is set. By contrast, if only a high value of the capacitance of such interdigital structures is desired, then a vanishing coupling coefficient is set. The setting of the coupling coefficient is effected by the selection of a suitable orientation of the transducers relative to the crystal axes of the substrate PS.

Figure 3B:
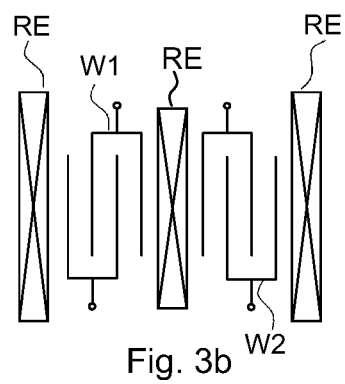
FIG. 3B shows two interdigital structures separated by a reflective element.

FIG. 3B illustrates a reflective element RE, which, produced as structured metallization on the surface of the piezoelectric substrate, is arranged between two transducers and separates the adjacent finger electrodes of the two transducers. If both transducers or their terminal electrode fingers facing one another are at different electrical potentials, then the ESD resistance is thereby improved. In particular, it is improved when the reflective element RE is interconnected with ground potential.

Figure 4A:
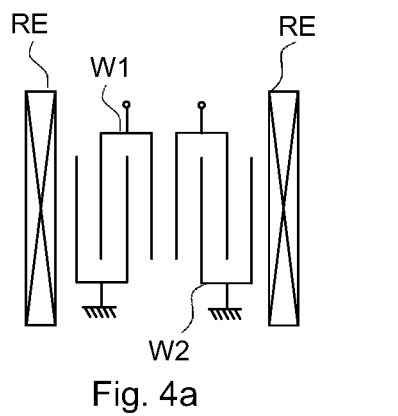
FIG. 4A shows two interdigital structures wherein adjacent finger electrodes are at different potentials.

FIG. 4A illustrates the problem of two interdigital transducers whose adjacent finger electrodes are at different potentials. The voltage present between the adjacent electrode fingers is generally dropped on a length which is of the order of magnitude of half a wavelength $\lambda$ of the surface acoustic waves generated by the transducer.

Figure 4B:
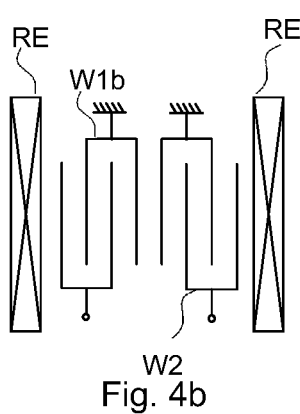
FIG. 4B shows two interdigital structures wherein adjacent electrode fingers are at ground potential.

FIG. 4B illustrates an alternative solution, in which the adjacent electrode fingers of different transducers are not at different potentials, but rather are both jointly at ground potential. The electrode fingers in FIG. 4B are arranged and interconnected in such a way that the voltage present between the two different DMS ports is not dropped across a path which is smaller than an acoustic wavelength $\lambda$. The breakdown strength of ESD pulses from one transducer to an adjacent transducer within a DMS structure is thus increased further.

Those features for improving the protection against ESD pulses which concern the arrangement of electrode fingers or resonators or the interconnection thereof are generally applicable equally to transducers in DMS structures and to transducers in other single- or multi-port resonators.

If the ESD protection is intended to be improved even further, even if the filter characteristic would then be worsened, the correspondingly jeopardized resonators which are interconnected (e.g., serially or in parallel) can also be cascaded.

A filter circuit according to the invention is not restricted to one of the exemplary embodiments described. Combinations of the exemplary embodiments and variations which encompass, e.g., still further serial or parallel resonators likewise constitute exemplary embodiments according to the invention.

LIST OF REFERENCE SYMBOLS

SP1: First signal port
SR: Series resonator
SAWF: SAW filter circuit
DMS: DMS filter
SP2: Second signal port
SV: Series interconnection composed of SAW resonators
PV: Parallel interconnection composed of SAW resonators
DMSP1: First DMS port
DMSP2: Second DMS port PS: Piezoelectric substrate
RE: Reflective element
EF: Electrode finger
W1: First DMS transducer
W2: Second DMS transducer

The invention claimed is:

1. A surface acoustic wave (SAW) filter circuit, comprising:
   a first signal port;
   a second signal port;
   a DMS (dual mode SAW) filter on a piezoelectric substrate having a first DMS port and at least one first DMS transducer interconnected with the first DMS port and a second DMS port with at least one second DMS transducer interconnected with the second DMS port; and
   a first interconnection comprising a first series interconnection comprising SAW resonators that are interconnected between the first signal port and the first DMS port and a parallel interconnection comprising SAW resonators that are interconnected in a parallel branch,
   wherein a static capacitance of the first series interconnection is at most four times a static capacitance of the at least one first DMS transducer;
   wherein directly adjacent electrode fingers of different transducers comprise a same polarity, and
   wherein a multi-port resonator is interconnected in the parallel branch of the first interconnection.

2. The SAW filter circuit according to claim 1, further comprising:
   a second series interconnection comprising SAW resonators that are interconnected between the second signal port and the second DMS port, wherein a static capacitance of the second series interconnection is at most four times a static capacitance of the at least one second DMS transducer.

3. The SAW filter circuit according to claim 2, wherein the first interconnection is interconnected with the first DMS port, and wherein the static capacitance of the first series interconnection is at most double the sum of a static capacitance of the first interconnection in the parallel branch and the static capacitance of the at least one first DMS transducer.

4. The SAW filter circuit according to claim 3, further comprising:
   a second interconnection comprising SAW resonators in a parallel branch, the second interconnection interconnected with the second DMS port,
   wherein the static capacitance of the second series interconnection is at most double the sum of a static capacitance of the second interconnection and of the static capacitance of the at least one second DMS transducer.

5. The SAW filter circuit according to claim 4, wherein the first series interconnection, the second series interconnection, the second interconnection or the DMS filter comprises a multi-port resonator,
   the SAW filter further comprising at least one floating reflector element that is not interconnected with ground and that is arranged between transducers of a multi-port resonator.

6. The SAW filter circuit according to claim 5, wherein
   the at least one floating reflector element is arranged between a first transducer and a second transducer,
   the at least one floating reflector element comprises at least two reflector fingers.

7. The SAW filter circuit according to claim 1, further comprising reflector elements arranged on the piezoelectric substrate between two outer electrode fingers that face one another and that have different polarities and are associated with different transducers.

8. The SAW filter circuit according to claim 7, wherein the different transducers are both transducers of the at least one first DMS transducer.

9. The SAW filter circuit according to claim 7, wherein the different transducers are transducers of a multi-port resonator.

10. The SAW filter circuit according to claim 1, further comprising:
    a first interconnection comprising SAW resonators in a parallel branch, the first interconnection interconnected with the first DMS port,
    wherein the static capacitance of the first series interconnection is at most double the sum of a static capacitance of the first interconnection in the parallel branch and the static capacitance of the at least one first DMS transducer.

11. The SAW filter circuit according to claim 10, wherein the first series interconnection or the first interconnection comprises resonators interconnected in a cascaded fashion.

12. The SAW filter circuit according to claim 10, further comprising:
    a second series interconnection comprising SAW resonators that are interconnected between the second signal port and the second DMS port, wherein a static capacitance of the second series interconnection is at most four times a static capacitance of the at least one second DMS transducer; and
    a second interconnection comprising SAW resonators in a parallel branch, the second interconnection interconnected with the second DMS port, wherein the static capacitance of the second series interconnection is at most double the sum of a static capacitances of the second interconnection and of the static capacitance of the at least one second DMS transducer.

13. The SAW filter circuit according to claim 1, comprising balanced signal routing in the first signal port and the first DMS port.

14. The SAW filter circuit according to claim 1, comprising balanced signal routing in the second signal port and the second DMS port.

15. The SAW filter circuit according to claim 1, wherein the directly adjacent electrode fingers are interconnected with ground.

16. The SAW filter circuit according to claim 1, further comprising a first transducer adjacent to the at least one second DMS transducer, wherein two electrode fingers that are directly adjacent but associated with different transducers are interconnected with ground.

17. The SAW filter circuit according to claim 1, wherein the first signal port or the second signal port is interconnected in series with capacitive elements that are either structured as metalized structures on the piezoelectric substrate or integrated as metalized areas in an HTCC or LTCC multilayer substrate on which the piezoelectric substrate is arranged.

18. The SAW filter circuit according to claim 1, wherein the multi-port resonator is interconnected in a branch to ground.

* * * * *